US007354281B1

(12) United States Patent
Brodsky et al.

(10) Patent No.: US 7,354,281 B1
(45) Date of Patent: Apr. 8, 2008

(54) METHOD AND APPARATUS FOR RESTRICTING ROTATIONAL MOMENT ABOUT A LONGITUDINAL AXIS OF SMT CONNECTORS

(75) Inventors: William L. Brodsky, Binghamton, NY (US); Mark G. Clark, Rochester, MN (US); Amanda E. E. Mikhail, Rochester, MN (US); Arvind K. Sinha, Rochester, MN (US); Scott A. Shurson, Mantorville, MN (US); Jason T. Stoll, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/683,512

(22) Filed: Mar. 8, 2007

(51) Int. Cl.
*H01R 9/22* (2006.01)
(52) U.S. Cl. ......................................... 439/78; 439/717

(58) Field of Classification Search ............ 439/78–83, 439/717
See application file for complete search history.

(56) References Cited

U.S. PATENT DOCUMENTS

| 6,264,501 | B1 * | 7/2001 | Hung et al. ............... 439/541.5 |
| 6,431,920 | B1 * | 8/2002 | Endres et al. ............... 439/717 |
| 6,638,114 | B2 * | 10/2003 | Lee ............................. 439/701 |
| 6,951,490 | B2 * | 10/2005 | De Faria et al. ............ 439/717 |

* cited by examiner

*Primary Examiner*—Khiem Nguyen
(74) *Attorney, Agent, or Firm*—Cantor Colburn LLP (57) ABSTRACT

An electrical connector includes a first connector body having an interlocking feature extending therefrom. The interlocking feature interlocks the first connector body with a complimentary interlocking feature extending from an adjacent second connector body to distribute a lateral force on either the first or second connector bodies across the adjacent connector body thereby reducing a rotational moment at a base of each electrical connector connected to a printed circuit board (PCB).

6 Claims, 6 Drawing Sheets

| CASE | SOLDER | | BOARD | |
|---|---|---|---|---|
| | M.P.* STRESS (PSI) | M.P.* STRAIN (× $10^4$ IN/IN) | DEFLECTION (MILS) | M.P.* STRAIN (× $10^4$ IN/IN) |
| BASELINE (TORQUE**) | 440 | 40 | 0.5 | 0 |
| CASE 1 (TORQUE) | 200 | 40 | 0.4 | 10 |
| CASE 2 (TORQUE) | 40 | 0 | 0.2 | 0 |

*MAX PRINCIPAL TENSOR
**TORQUE BASED ON 4.3 LBF

FIG. 7

METHOD AND APPARATUS FOR RESTRICTING ROTATIONAL MOMENT ABOUT A LONGITUDINAL AXIS OF SMT CONNECTORS

BACKGROUND OF THE INVENTION

1. Field of the Invention

This invention relates to a method and apparatus for restricting a rotational moment about a longitudinal axis of surface-mount (SMT) connectors, and particularly to a method and apparatus for restricting the rotational moment about the longitudinal axis of SMT DIMM Sockets and other SMT connectors.

2. Description of Background

In computer systems such as personal computers, a socket is referred to as an electrical connector generally mounted on a motherboard (main board) in order to connect extension boards such as extended interface boards for peripheral devices or extended memory boards to the motherboard. The motherboard and extension boards can be electrically connected by plugging the extension boards into the electrical connector.

Figure 1:
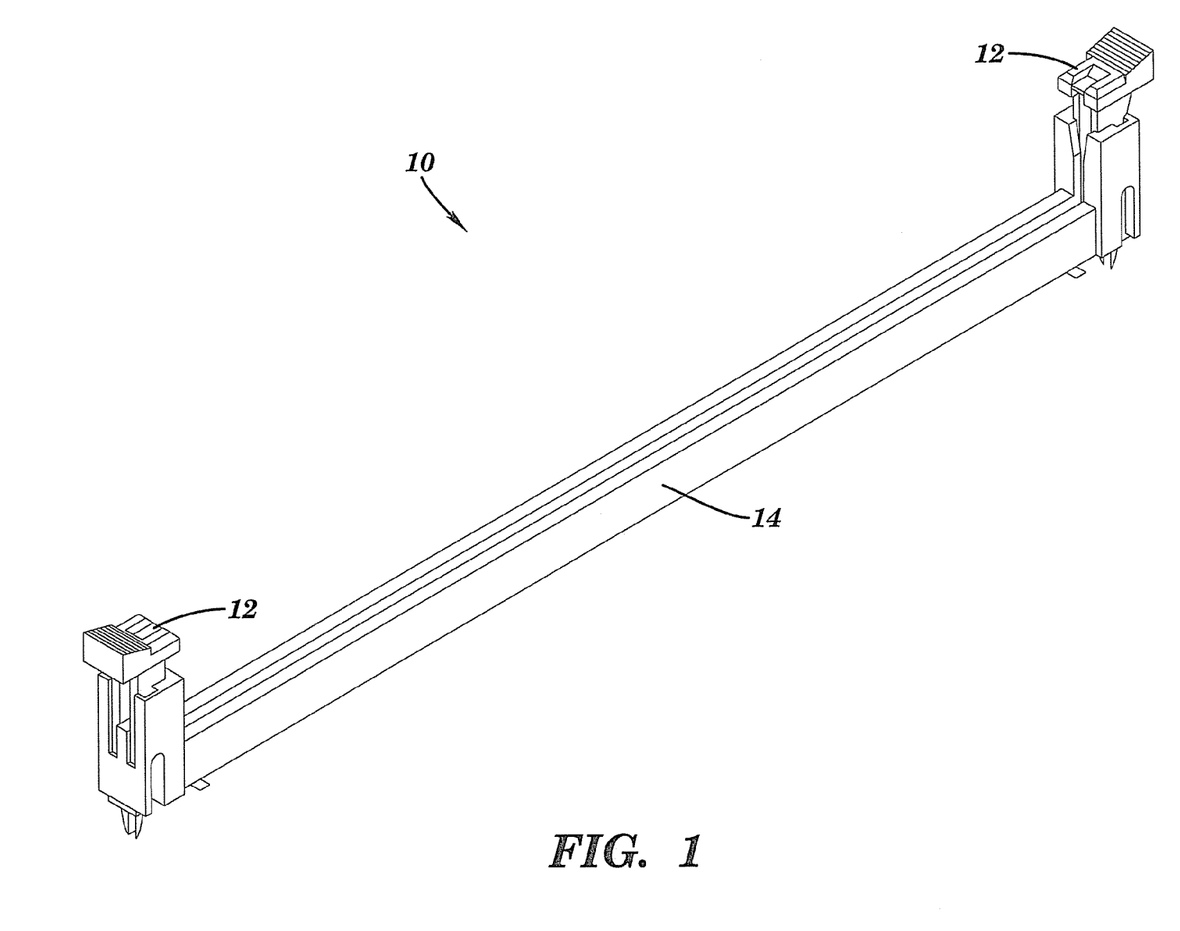
FIG. 1 illustrates a perspective view of a conventional DIMM connector.
Figure 2:
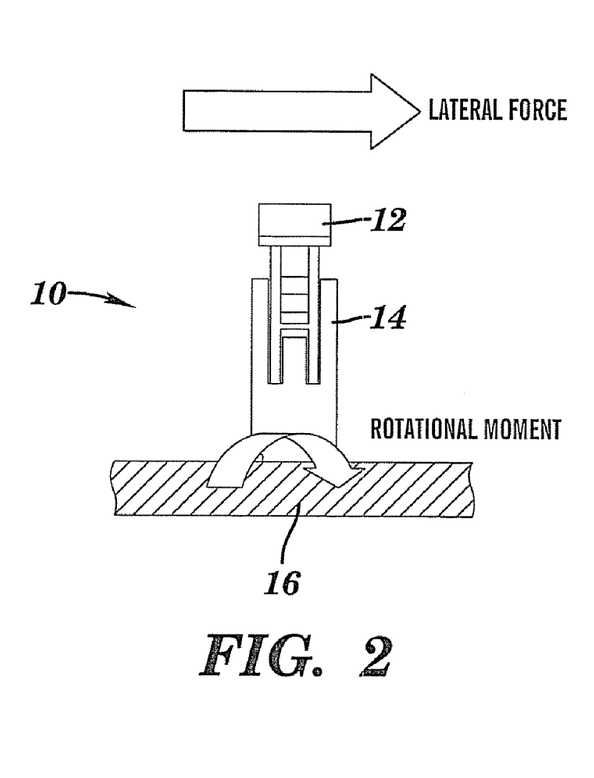
FIG. 2 illustrates an elevation end view of the DIMM connector of FIG. 1 surface mounted to a PCB surface of a motherboard.

The structure of a common electrical connector will be described here with the example of an electrical connector used to connect an extension memory module (hereinafter, "module") referred to as a DIMM (dual in-line memory module) as illustrated in FIGS. 1 and 2. This module corresponds to the extension board described above.

A dual in-line memory module (DIMM) is more and more popular for use in the present PC industry, and thus uses a DIMM socket connector mounted on the motherboard for mechanical and electrical interconnect of the corresponding DIMM therein for signal transmission between the motherboard and the DIMM. A main feature of the typical DIMM connector as illustrated in FIGS. 1 and 2 is that the DIMM connector 10 includes generally a pair of latch/eject members 12 at its two opposite ends so that such DIMM may not only be properly retained in the DIMM connector 10 without possibility of inadvertent withdrawal by vibration or external impact, but also easily ejected from the DIMM connector 10 by rotational movement of the latch/eject member 12.

With more of the industry moving to SMT (Surface Mount Technology) connectors due to PCB wiring density, path length, and electrical signal integrity concerns, new mechanical requirements emerge due to the delicate SMT interface, compared to the more mechanically robust compliant pin and pin-though-hole interfaces in previous applications. This disclosure addresses the forces and strains incurred at the SMT solder joint and pad interface due to rotation about the long axis of an SMT DIMM socket or housing 14, for example, as well as the possibility of pad delamination at the card surface, by minimizing the overall rotation about the longitudinal axis of the SMT DIMM socket, as illustrated in FIG. 2.

Rotation about the longitudinal axis of the SMT DIMM socket 14 is caused by a number of factors. One factor is the amount and location of the center of mass of the DIMM module (not shown). The module acts as a cantilevered beam when assembled into the socket 14, and, where shock, vibration, and dead load effects can all contribute to moments being applied to the DIMM connector 10, particularly when the DIMM module is plugged parallel to the ground and perpendicular to a motherboard 16 on which the DIMM connector 10 is surface mounted thereto. Another factor is due to the design of the connector 10 itself, allowing rotation of the DIMM module upon insertion. The traditional DIMM socket allows approximately 10 degrees of rotation centered about a perpendicular plane to a printed circuit board (PCB) surface defined by the motherboard 16. This allowable rotation, coupled with the high insertion forces required to mate the interface between the DIMM module and the socket, results in a high lateral load forming a torsional moment about the longitudinal axis of the connector inducing an undesirable shear stress to the SMT joint and PCB pad, regardless of orientation of the module and connector with respect to gravity. This stress to the SMT joints, as well as the SMT pad, creates a reliability concern, and the possibility of pad delamination.

Previous designs were mechanically anchored to the PCB via the pin-through-hole or compliant pin nature of the PCB leads, as discussed above which provided a larger reaction force to the lateral shear and torsional moments than the present SMT joints provide. With the present surface-mount design, the reaction forces are carried through the SMT joints and PWB solder pads, which are not as robust as pin-in-hole connections to withstand such forces, and pose a reliability concern.

SUMMARY OF THE INVENTION

The shortcomings of the prior art are overcome and additional advantages are provided through the provision of an apparatus for supporting at least one electrical connector body. The apparatus includes a first connector body having an interlocking feature extending therefrom. The interlocking feature interlocks the first connector body with a complimentary electrical connector which includes a first connector body having an interlocking feature extending therefrom. The interlocking feature interlocks the first connector body with a complimentary interlocking feature extending from an adjacent second connector body to distribute a lateral force on either the first or second connector bodies across the adjacent connector body thereby reducing a rotational moment at a base of each electrical connector connected to a printed circuit board (PCB).

In another exemplary embodiment, a system includes: a motherboard; a plurality of electrical connectors surface mounted to the motherboard, each electrical connector including a connector body configured to receive and electrically connect an electrical module; and an interlocking feature extending from each electrical connector. The interlocking feature interlocks a first connector body with a complimentary interlocking feature extending from an adjacent second connector body to distribute a lateral force on either the first or second connector bodies across the adjacent connector body thereby reducing a rotational moment at a base of each electrical connector connected to the motherboard.

In still another exemplary embodiment, a method of constraining rotation of electrical connectors about a longitudinal axis thereof at an interface of a motherboard to which it is surface mounted is disclosed. The method includes: configuring each electrical connector including a connector body to receive and electrically connect an electrical module; and extending an interlocking feature from each electrical connector. The interlocking feature interlocks a first connector body with a complimentary interlocking feature extending from an adjacent second connector body to distribute a lateral force on either the first or second connector bodies across the adjacent connector body thereby reducing a rotational moment at a base of each electrical connector connected to the motherboard.

The present invention addresses the over-stress of the SMT joint due to connector rotation by restricting rotation of the DIMM connectors on the circuit card via rigid member braces between the connectors.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

Tuning now to the drawings in greater detail, the structure of a common electrical connector will be described here with the example of an electrical connector used to connect an extension memory module (hereinafter, "module") referred to as a DIMM (dual in-line memory module). This module corresponds to the extension board described above.

Figure 3:
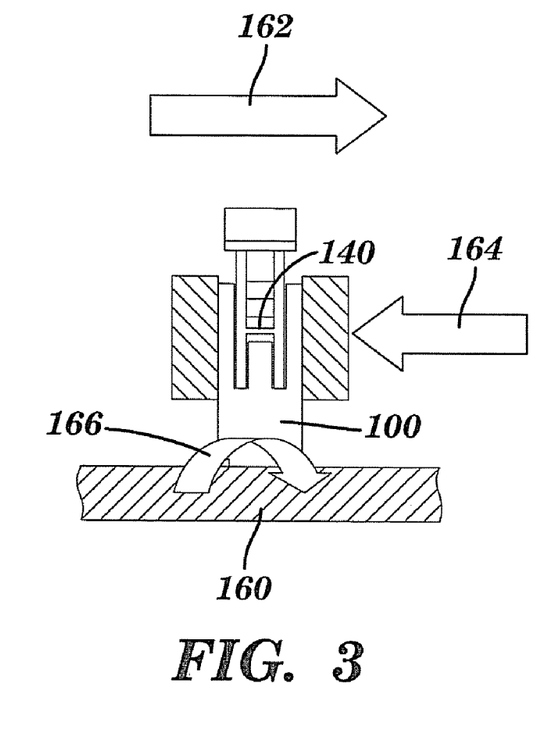
FIG. 3 illustrates an elevation end view of the DIMM connector of FIG. 1 surface mounted to a PCB surface of a motherboard with an exemplary embodiment of a lateral constraint member disposed on either side of the DIMM connector.

FIG. 3 is a schematic elevation end view illustrating the structure of an exemplary embodiment of an electrical connector assembly 100 for a DIMM (not shown) according to the present invention. The electrical connector assembly 100 is an electrical connector which is used in desktop personal computers, for example. In FIG. 3, the connector assembly 100 is defined by a housing 140 for housing a respective module (not shown). The modules are arranged in several rows (e.g., two rows in FIG. 5) on a PCB or motherboard 160. The user inserts a module (not shown) in the housing 140, allowing memory to be added on. When the housing 140 is arranged standing up on the motherboard 160, as illustrated in FIG. 3, the module is held perpendicular to the motherboard 160. In order to counteract a lateral force indicated with arrow 162 when inserting a module (not shown) for electrical connection with the connector assembly 100, a reaction force indicated with arrow 164 may be applied to preserve the integrity of the SMT joint interface between the connector assembly 100 and the motherboard 160. The reaction force 164 is applied by exemplary interstitial braces 170 acting as rigid lateral constraint members disposed on either side of each connector assembly 100. The reaction force 164 reduces a rotational moment 166 about a longitudinal axis defined by the connector 100 assembly at the SMT joint interface between the connector 100 assembly and the motherboard 160 when the lateral force 162 is applied.

Still referring to FIG. 3, it will be recognized by those skilled in the art that in the force diagram thereof, the opposite (reverse) would be true as well, as the interstitial braces 170 as rigid members would contact both sides of the DIMM connector assembly 100. The force depicted in FIG. 3 would be induced by either a non-perpendicular plugging (winch is allowed in the connector design), or by gravitational force if the overall assembly was rotated 90 degrees, as is typical in system applications.

The interstitial braces 170 can be applied to the connector assembly 100 in various ways, as described hereinbelow. In an exemplary embodiment as illustrated in FIG. 3, the interstitial braces 170 are defined by protruding features extending from the connector assembly 100. The protruding features 170 may be separate or integral with the housing 140 defining the connector assembly 100. The protruding features 170 interlock with complimentary protruding features 170 extending from an adjacent connector assembly 100 to form compound connector assemblies, as illustrated in FIGS. 4-6.

Figure 5:
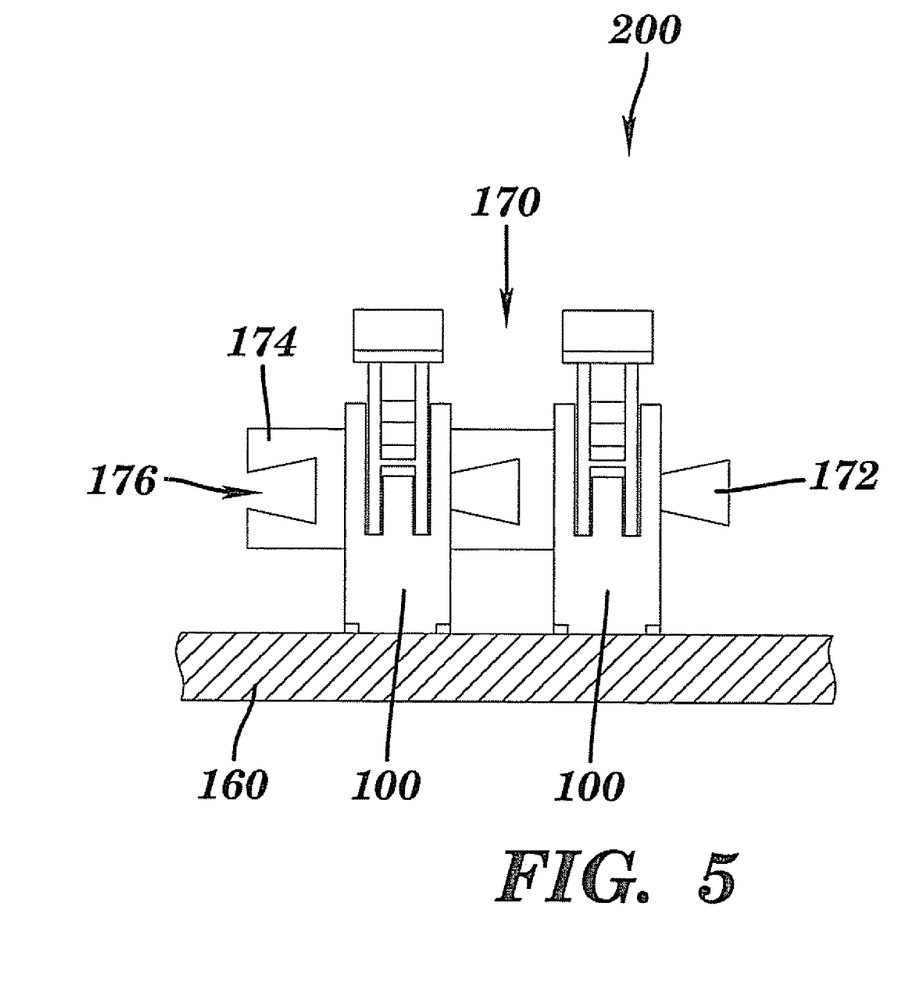
FIG. 5 illustrates an elevation end view of two of the DIMM connectors of FIG. 4 with the exemplary embodiment of rigid lateral constraint members extending therefrom and having interstitial interlocking features therebetween.
Figure 6:
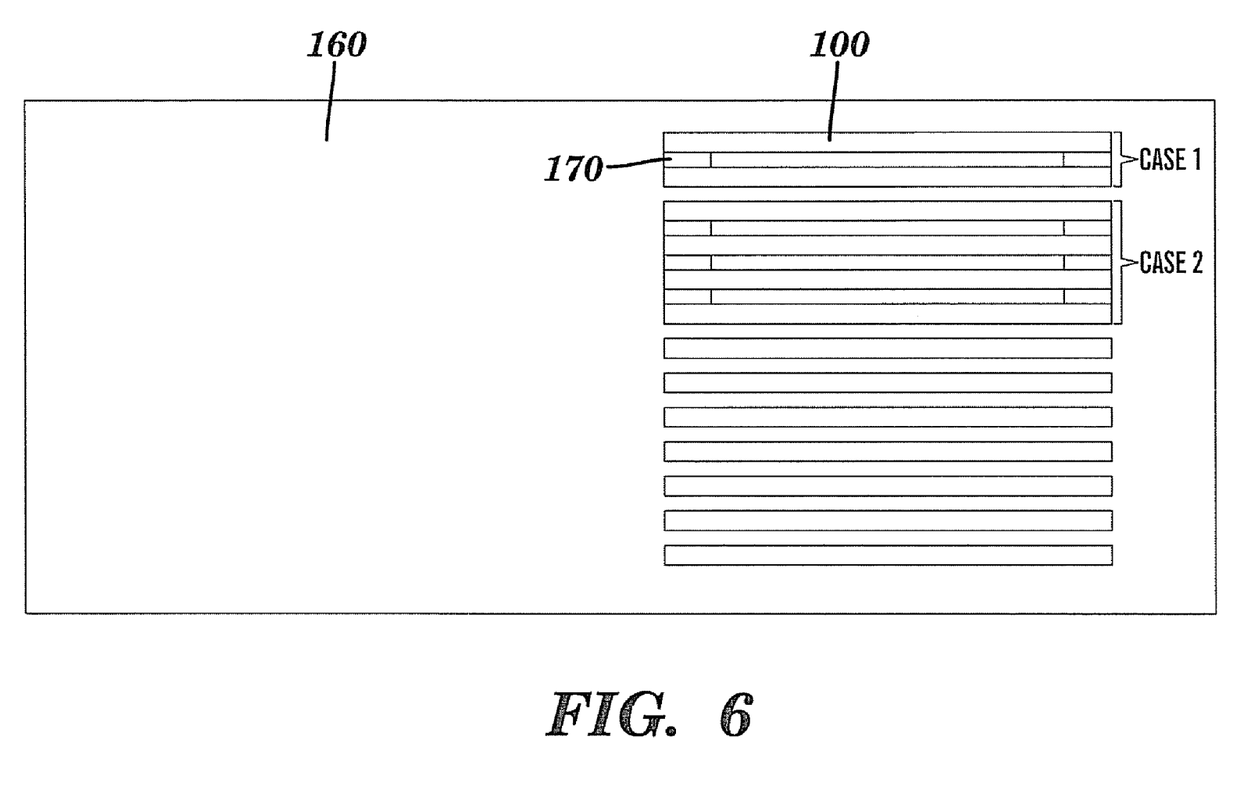
FIG. 6 illustrates a top plan view of an exemplary embodiment of lateral constraint members between two DIMM connectors (case 1) and four DIMM connectors (case 2)

Referring now to FIG. 5, the protruding features 170 on the connector assembly 100 include interlocking features 172, 174 which interlock with respective complimentary configured interlocking features 172, 174 extending from an adjacent connector assembly. In other words, each connector assembly 100 includes a tongue 172 extending on one side and a grooved piece 174 extending from an opposite side. In this manner, a tongue 172 extending from one connector assembly may interlock with a groove 176 of the grooved piece 174 extending from an adjacent connector assembly providing an interstitial brace 170 between the joined two adjacent connector assemblies. Possible geometries contemplated for the complimentary interlocking features 172, 174 include a tongue-aid-groove configuration or dove-tail configuration, for example, but is not limited thereto.

Figure 4:
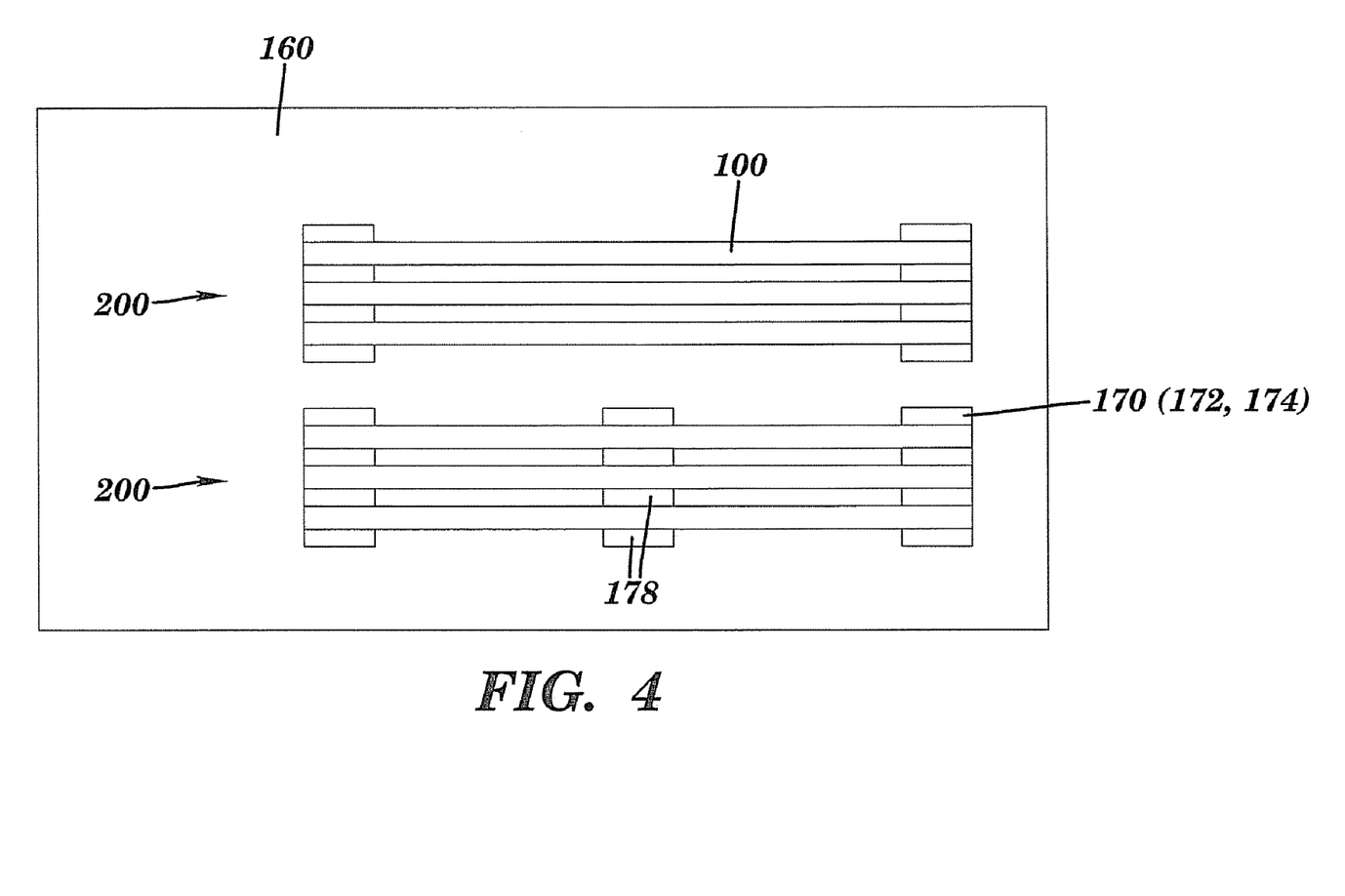
FIG. 4 illustrates a top plan view of DIMM connectors surface mounted to the PCB surface of the motherboard with an exemplary embodiment of lateral constraint members having interstitial interlocking rigid features.

Referring now to FIG. 4, the ganging of connector assemblies 100 provides an assembly 200 of a given number of connector assemblies 100 as one rigid entity and provides a more stable geometry and minimizes the rotation of any one connector assembly 100 in the gang. The interlocking features 170 are not limited to being located at the ends of the connector assemblies, as illustrated in FIG. 6, but can be placed at multiple locations along a body defining each connector assembly 100, as determined by the amount of reaction force 164 required to counteract the lateral force 162 (FIG. 3). For example, FIG. 4 illustrates two gang assemblies 200. One gang assembly 200 has the interlocking features 170 located at ends of the connector assemblies 100 while the other gang assembly 200 has the interlocking features 170 located at opposing ends and a middle portion of each connector assembly 100. Thus, the interlocking features 172, 174 may have various configurations and may be disposed along an entire length, at ends, or at ends and midsections of a connector assembly 100.

The interlocking features 172, 174 can also be designed such that they do not nut the entire height of the connector, as illustrated in FIGS. 3 and 5, such that a volume is allowed for component placement below the features on PCB 160. Although it is desirable, it not necessary, to leave a volume beneath the interlocking sections to allow for component placement or increased air flow between PCB 160 and a bottom surface defining the interlocking features 172, 174 extending from each connector assembly 100.

The geometry of the interlocking features 172, 174 is not specific, as they can be designed for ease of disassembly/rework of the individual connector assemblies 100 in the ganged assembly 200, or other factors specific to the given application. One advantage to a vertically-locking dovetail/interlock (not shown in FIG. 5) is that it allows for vertical removal of the DIMM connector assemblies 100 in rework. In other words, it is preferable that the interlocking features 172, 174 of FIG. 5 be rotated 90 degrees so that they interlock vertically to allow for potential removal of the connector assembly 100 from a ganged assembly 200. The reworkability of this design is an advantage over one large connector assembly with multiple slots resembling the ganged assembly 200. Instead of pulling off an entire large connector assembly with multiple slots in rework, an individual isolated connector assembly 100 can be removed without disturbing the adjacent connector assemblies 100 of a ganged assembly 200. It will be recognized by those skilled in the pertinent art that this option for orientation, as well as the one depicted in FIG. 5, is contemplated for all embodiments.

Still referring to FIG. 4, it will be recognized that having interlocking connector assemblies 100 limits the pitch of the connectors (e.g., limits the number of connector assemblies per unit area). Therefore, in alternative exemplary embodiments, the interlocking interstitial braces may accept a secondary piece, the secondary piece being of various lengths to accommodate various pitches. This alternative exemplary embodiment is specifically valuable to lock adjacent connector assemblies 100 after they have been installed onto the PCB 160.

For example, referring to the lower gang assembly 200 of FIG. 4, if there are only two connector assemblies 100 interlocked together (although three are shown in FIG. 4), in addition to the first and second interlocking features 172, 174 disposed at each opposing end of the connector assembly, respectively, there is at least a third interlocking feature 178 in a middle portion of the connector assembly 100. This third interlocking feature 178 is configured to accommodate other connector assemblies of various pitches. One method of adjusting the connector pitch is by a variable length linkage between locking features on the connector. This could be a shaft in sleeve structure which provides a telescopic action to the linkage and still provides a moment couple to the connector locking features.

Figure 7:
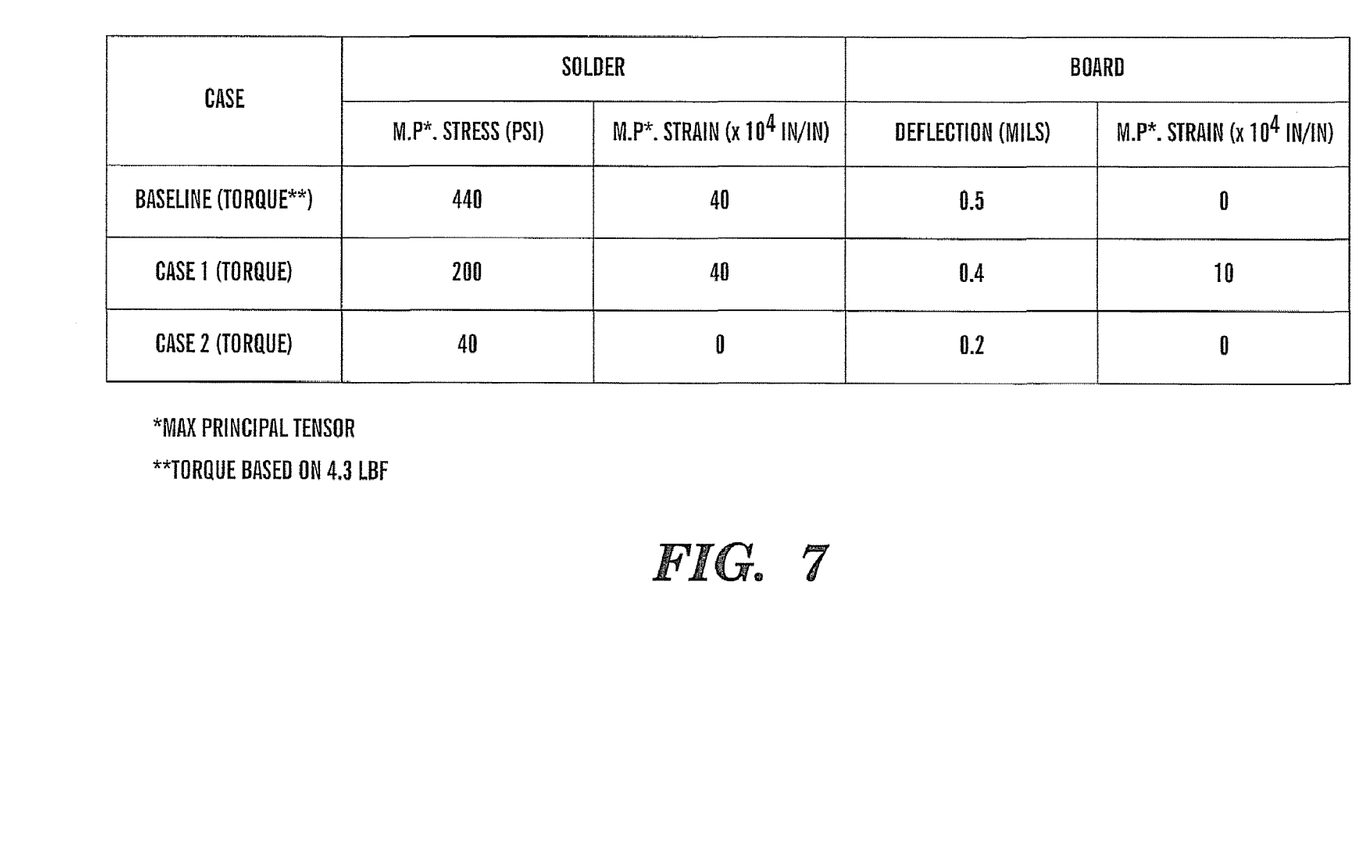
FIG. 7 illustrates a table of results of finite element modeling for cases 1 and 2 of FIG. 6 showing that constraining the rotation of the DIMM connectors via rigid-body members contacting/joining the DIMM connector housings greatly decreases the allowable rotation of the connector and thus the rotational moment and shear stress of the SMT joints and PCB pads.

Referring to FIGS. 6 and 7, it has been proven via finite element modeling that constraining the rotation of the DIMM connector assemblies 100 via rigid-body members (e.g., interstitial braces 170) contacting/joining the housings thereof greatly decreases the allowable rotation of the connector assembly 100 and thus the rotational moment and shear stress of the SMT joints and PCB pads. Material properties, dimensions, and tolerances of the body/housing interface are application dependent.

Case 1 of FIGS. 6 and 7 illustrates a situation where interstitial braces 170 are disposed at ends and between alternate pairs of DIMM connector assemblies 100, having a 7 mm length. Case 2 of FIGS. 6 and 7 illustrates a situation where interstitial braces 170 are disposed between a group of four DIMM connector assemblies 100 and at ends thereof. The DIMM connector assemblies 100 were 3, 4, 5, 6 and 7 mm in length and using anisotropic material data sets for all materials in the finite element model. In both cases 1 and 2, the allowable pad stress is 44-65 psi.

From the above described exemplary embodiments, the following attributes of the present invention are disclosed. A connector assembly includes a body having interlocking features, wherein the interlocking features interlock one connector body to an adjacent connector body. In this manner a lateral force applied thereto is distributed across the adjacent connectors thereby reducing the rotational moment at the base of each connector. The interlocking features may be placed in multiple locations. More and more connector bodies can be interlocked depending on the expected amount of lateral force (the more force expected, the more interlocked connectors, thereby distributing the rotational moment across all interlocked connectors.

While the preferred embodiment to the invention has been described, it will be understood that those skilled in the art, both now and in the future, may male various improvements and enhancements which fall within the scope of the claims which follow. These claims should be construed to maintain the proper protection for the invention first described.

What is claimed is:

1. A method of constraining rotation of electrical connectors about a longitudinal axis thereof at an interface of a motherboard to which it is surface mounted, the method comprising:

configuring a connector body of each electrical connector to receive and electrically connect an electrical module; and extending an interlocking feature from each electrical connector, wherein the interlocking feature rigidly interlocks a first connector body with a complimentary interlocking feature extending from an adjacent second connector body to distribute a lateral force on either the first or second connector bodies across a longitudinal side of the adjacent connector body thereby reducing a rotational moment at a base of each electrical connector connected to the motherboard, and the interlocking features are configured to separate the first connector body from the adjacent second connector body and maintain a space therebetween.

2. The method of claim 1, further comprising:

disposing the interlocking features of the first and second connector bodies in multiple locations along a length defining the longitudinal sides of the first and second connector bodies.

3. The method of claim 2, further comprising disposing the interlocking features at least at opposing ends or middle portions along the longitudinal sides defining each of the first and second connector bodies.

4. The method of claim 1, wherein the interlocking features are a locking dovetail interlock feature or locking tongue-and-groove feature and interlock vertically, to facilitate removal of at least one of the first and second connector bodies.

5. The method of claim 1, wherein more than two connector bodies can be interlocked depending on an expected amount of lateral force, thereby distributing the rotational moment across all interlocked connectors, and wherein if two connectors are interlocked together, in addition to first and second interlocking features at each end of the two connectors, respectively, there is at least a third interlocking feature in a middle of the two connectors configured to accommodate another adjacent connector of a same or different pitch of the other two connectors.

6. The method of claim 1, further comprising configuring the interlocking features having a volume therebeneath and above the motherboard allowing for component placement or increased air flow.

* * * * *